United States Patent
Eom

(10) Patent No.: US 9,887,230 B2
(45) Date of Patent: Feb. 6, 2018

(54) SEPARATION TYPE UNIT PIXEL OF IMAGE SENSOR HAVING THREE-DIMENSIONAL STRUCTURE

(71) Applicant: SiliconFile Technologies Inc., Seongnam-si, Gyeonggi-do (KR)

(72) Inventor: Jae Won Eom, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 275 days.

(21) Appl. No.: 14/430,727

(22) PCT Filed: Sep. 24, 2013

(86) PCT No.: PCT/KR2013/008527
§ 371 (c)(1),
(2) Date: Mar. 24, 2015

(87) PCT Pub. No.: WO2014/051306
PCT Pub. Date: Apr. 3, 2014

(65) Prior Publication Data
US 2015/0236065 A1    Aug. 20, 2015

(30) Foreign Application Priority Data
Sep. 26, 2012   (KR) .................. 10-2012-0107112

(51) Int. Cl.
*H01L 27/146*   (2006.01)
*H01L 27/148*   (2006.01)

(52) U.S. Cl.
CPC ...... *H01L 27/14643* (2013.01); *H01L 27/148* (2013.01); *H01L 27/14612* (2013.01); *H01L 27/14636* (2013.01)

(58) Field of Classification Search
CPC ............. H01L 27/146; H01L 27/14601; H01L 27/14603; H01L 27/14609;
(Continued)

(56) References Cited
U.S. PATENT DOCUMENTS 6,566,697 B1 *   5/2003   Fox ................. H04N 3/155
                                           257/291
8,462,245 B2 *   6/2013   Kwon ............... H04N 5/365
                                           250/208.1
(Continued)

FOREIGN PATENT DOCUMENTS

CN     101213669    7/2008
CN     101681917    3/2010
(Continued)

OTHER PUBLICATIONS

International Search Report for International Application No. PCT/KR2013/008527, dated Jan. 8, 2014.
(Continued)

*Primary Examiner* — John Lee
(74) *Attorney, Agent, or Firm* — IP & T Group LLP

(57) ABSTRACT

The present invention introduces a separation type unit pixel of an image sensor having a three-dimensional (3D) structure, which is capable of maximizing transmission efficient of a charge generated through a photodiode to a floating diffusion area. The separation type unit pixel may include a first wafer on which a photodiode and a transmission transistor are formed and a second wafer on which a reset transistor and a source follower transistor are formed. In particular, the photodiode has a positive region to which an N_ground voltage is applied, the N_ground voltage having a lower voltage level than a ground voltage used in the second wafer.

18 Claims, 6 Drawing Sheets

(58) Field of Classification Search
CPC ......... H01L 27/14612; H01L 27/14632; H01L 27/14634; H01L 27/14636; H01L 27/14638; H01L 27/14643; H01L 27/148; H01L 27/14806; H01L 27/14812
See application file for complete search history.

(56) References Cited

U.S. PATENT DOCUMENTS

| | | | | |
|---|---|---|---|---|
| 8,624,305 B2* | 1/2014 | Okita | ............... | H01L 27/14632 257/291 |
| 9,350,930 B2* | 5/2016 | Lee | ............... | H04N 5/378 |
| 2003/0020002 A1* | 1/2003 | Lee | ............... | H01L 27/14603 250/208.1 |
| 2007/0147132 A1* | 6/2007 | Lee | ............... | H04N 3/1512 365/185.23 |
| 2008/0035966 A1* | 2/2008 | Hwang | ............... | H01L 27/14609 257/292 |
| 2008/0083939 A1* | 4/2008 | Guidash | ............... | H01L 27/14634 257/292 |
| 2009/0190012 A1* | 7/2009 | Mabuchi | ............... | H01L 27/14632 348/294 |
| 2009/0256156 A1* | 10/2009 | Hsieh | ............... | H01L 27/14609 257/72 |
| 2010/0013907 A1* | 1/2010 | Lee | ............... | H01L 27/1469 348/46 |
| 2010/0019130 A1* | 1/2010 | Lee | ............... | H01L 27/14634 250/208.1 |
| 2010/0078751 A1* | 4/2010 | Kim | ............... | H01L 27/14665 257/459 |
| 2010/0117178 A1* | 5/2010 | Kim | ............... | H01L 27/14625 257/432 |
| 2010/0164046 A1* | 7/2010 | Kim | ............... | H01L 27/1469 257/446 |
| 2010/0176271 A1* | 7/2010 | Rim | ............... | H01L 27/14609 250/208.1 |
| 2010/0258890 A1* | 10/2010 | Ahn | ............... | H01L 27/14636 257/432 |
| 2011/0115003 A1* | 5/2011 | Okita | ............... | H01L 27/14632 257/291 |
| 2011/0121162 A1* | 5/2011 | Murata | ............... | H01L 27/14603 250/208.1 |
| 2012/0007665 A1* | 1/2012 | Lee | ............... | H01L 27/14603 327/543 |
| 2012/0147237 A1* | 6/2012 | Xu | ............... | H04N 5/3745 348/301 |
| 2013/0032697 A1* | 2/2013 | De Wit | ............... | H04N 5/3745 250/208.1 |
| 2013/0063637 A1* | 3/2013 | Ebihara | ............... | H04N 5/3741 348/300 |
| 2013/0068929 A1* | 3/2013 | Solhusvik | ............... | H01L 27/14634 250/208.1 |
| 2013/0140441 A1* | 6/2013 | Innocent | ............... | H04N 5/3745 250/214 A |
| 2013/0264467 A1* | 10/2013 | Hong | ............... | H01L 27/14609 250/208.1 |
| 2014/0042298 A1* | 2/2014 | Wan | ............... | H01L 27/14634 250/208.1 |
| 2015/0236065 A1* | 8/2015 | Eom | ............... | H01L 27/14643 250/208.1 |

FOREIGN PATENT DOCUMENTS

| | | | | |
|---|---|---|---|---|
| CN | 101859761 | | 10/2010 | |
| JP | 2005347691 | | 12/2005 | |
| JP | 2006032497 | | 2/2006 | |
| JP | 2008235478 | | 10/2008 | |
| JP | 2010530633 | | 9/2010 | |
| JP | 2011091474 | | 5/2011 | |
| JP | 2012033894 | | 2/2012 | |
| KR | 10-2007-0000578 | | 1/2007 | |
| KR | 10-2007-0120456 | | 12/2007 | |
| WO | WO 2008032914 A1 * | | 3/2008 | ....... H01L 27/14603 |

OTHER PUBLICATIONS

Written Opinion of the International Searching Authority for International Application No. PCT/KR2013/008527 with English translation, dated Jan. 8, 2014.

Office Action issued by the Japanese Patent Office dated Jun. 13, 2017.

Office Action issued by the State Intellectual Property Office dated Apr. 5, 2017.

* cited by examiner

SEPARATION TYPE UNIT PIXEL OF IMAGE SENSOR HAVING THREE-DIMENSIONAL STRUCTURE

TECHNICAL FIELD

The present disclosure relates to a separation type unit pixel of an image sensor, and more particularly, to a separation type unit pixel of an image sensor, which applies a lower voltage than a ground voltage supplied to elements formed on a second wafer to a positive region of a photodiode formed on a first wafer, thereby maximizing charge transmission efficiency.

BACKGROUND ART

An image sensor circuit installed in each pixel basically includes a photodiode, a transmission transistor, a source follower transistor, a select transistor, and a reset transistor. The transmission transistor transmits a charge generated through the photodiode to a floating diffusion area, the source follower transistor generates a converted voltage corresponding to the transmitted charge, the select transistor outputs the converted voltage, and the reset transistor rests the floating diffusion area.

In order to implement more pixels in a predetermined area, an area allocated to a unit pixel is inevitably reduced. As described above, however, the unit pixel must include the plurality of transistors and the photodiode which are formed therein. Thus, an area allocated to the photodiode for receiving light is limited by an area occupied by the plurality of transistors. In order to overcome such a disadvantage, the following method has been proposed: the photodiode and the transmission transistor for transmitting a charge generated through the photodiode are formed on one wafer, and the other transistors are formed on another wafer.

DISCLOSURE

Technical Problem

Various embodiments are directed to a separation type unit pixel of an image sensor having a 3D structure, which is capable of maximizing transmission efficiency of transmitting a charge generated through a photodiode to a floating diffusion area.

Technical Solution

In an embodiment, there is provided a separation type unit pixel of an image sensor which generates a converted voltage corresponding to incident light. The separation type unit pixel may include: a first wafer comprising a photodiode configured to generate a charge corresponding to incident light, a first pad, and a transmission transistor configured to transmit the charge generated through the photodiode to the first pad in response to a transmission control signal; and a second wafer comprising a second pad, a source follower transistor configured to generate a converted voltage corresponding to a charge transmitted to the second pad, and a reset transistor configured to commonly reset the second pad and a gate of the source follower transistor in response to a reset control signal. The photodiode may have a positive region to which an N_ground voltage is applied, the N_ground voltage having a lower voltage level than a ground voltage used in the second wafer.

In an embodiment, there is provided a separation type unit pixel of an image sensor which generates a converted voltage corresponding to incident light. The separation type unit pixel may include: a first wafer comprising a photodiode configured to generate a charge corresponding to incident light, a first pad, a transmission transistor configured to transmit the charge generated through the photodiode to the first pad in response to a transmission control signal, and a reset transistor configured to reset a common terminal of the first pad and the transmission transistor in response to a reset control signal; and a second wafer comprising a second pad and a source follower transistor configured to generate a converted voltage corresponding to a charge transmitted to the second pad. The photodiode may have a positive region to which an N_ground voltage is applied, the N_ground voltage having a lower voltage level than a ground voltage used in the second wafer.

In an embodiment, there is provided a separation type unit pixel of an image sensor which generates a converted voltage corresponding to incident light. The separation type unit pixel may include: a first wafer comprising a first pad, a first photodiode configured to generate a charge corresponding to incident light, a first transmission transistor configured to transmit the charge generated through the first photodiode to the first pad in response to a first transmission control signal, a second photodiode configured to generate a charge corresponding to incident light, and a second transmission transistor configured to transmit the charge generated through the second photodiode to the first pad in response to a second transmission control signal; and a second wafer comprising a second pad, a source follower transistor configured to generate a converted voltage corresponding to a charge transmitted to the second pad, and a reset transistor configured to commonly reset the second pad and a gate of the source follower transistor in response to a reset control signal. Each of the first and second photodiodes may have a positive region to which an N_ground voltage is applied, the N_ground voltage having a lower voltage level than a ground voltage used in the second wafer.

Advantageous Effects

The separation type unit pixel of an image sensor having a 3D structure in accordance with the embodiments of the present invention may effectively transmit a charge generated through the photodiode to the floating diffusion area, and vary the level of the voltage source supplied to the reset transistor, thereby efficiently resetting the floating diffusion area.

MODE FOR INVENTION

Figure 1:
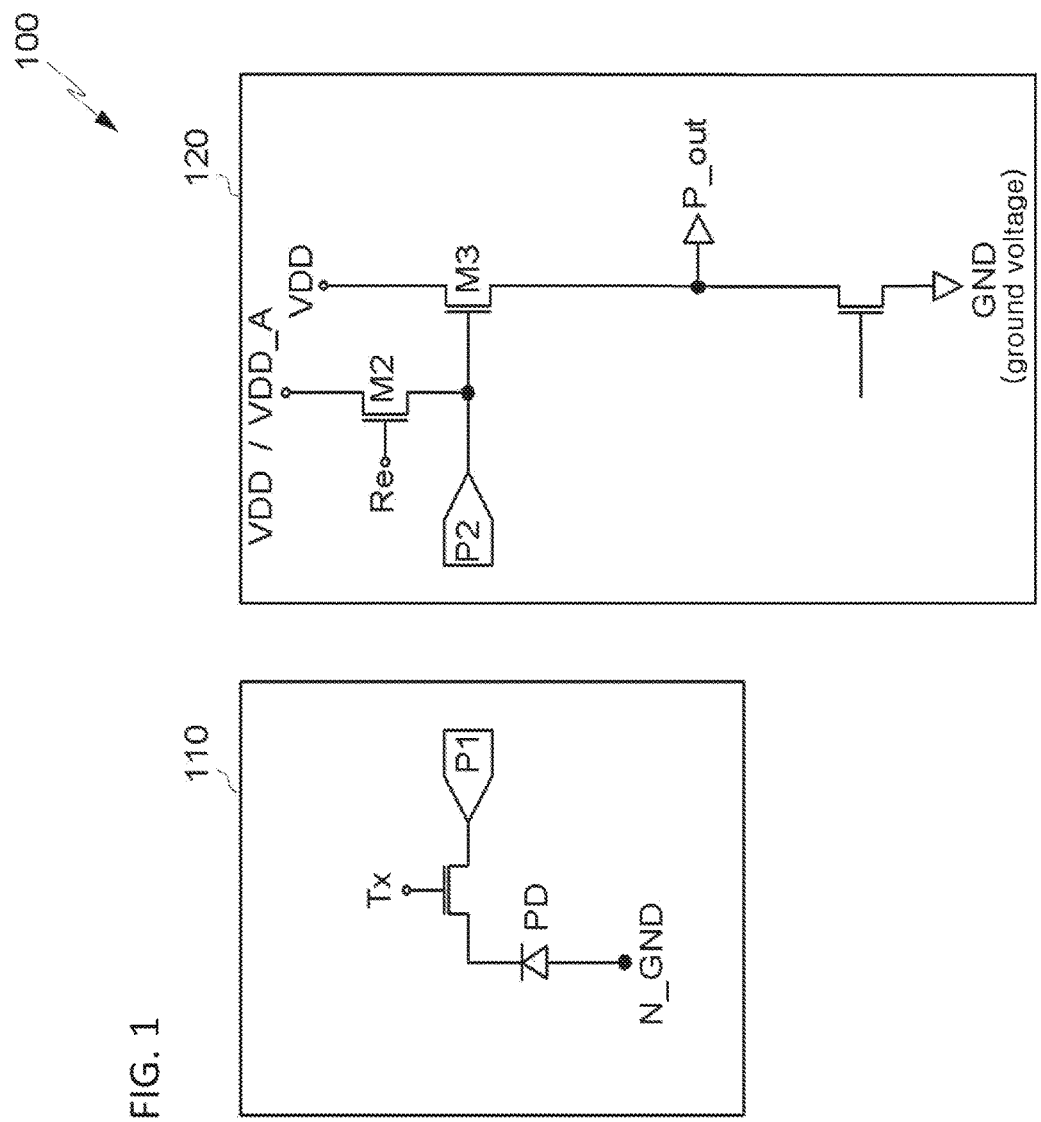
FIG. 1 illustrates a separation type unit pixel of an image sensor having a 3D structure in accordance with a first embodiment of the present invention.

Hereafter, embodiments of the present invention will be described below in more detail with reference to the accompanying drawings. Throughout the disclosure, like reference numerals refer to like parts throughout the various figures and embodiments of the disclosure.

FIG. 1 illustrates a separation type unit pixel of an image sensor having a three-dimensional (3D) structure in accordance with a first embodiment of the present invention.

Referring to FIG. 1, a plurality of components forming the separation type unit pixel 100 of the image sensor having a 3D structure in accordance with the first embodiment of the present invention may be divided and formed on two wafers 110 and 120.

The first wafer 110 may include a photodiode PD and a transmission transistor M1 which are integrated thereon, and the second wafer 120 may include a reset transistor M2 and a source follower transistor M3 which are integrated thereon.

The photodiode PD may have a positive region to which an N_ground voltage N_GND is applied, the N_ground voltage N_GND having a lower voltage level than a ground voltage GND used in the second wafer 120. The transmission transistor M1 may have one terminal coupled to a negative region of the photodiode PD, the other terminal coupled to a first pad P1, and a gate configured to receive a transmission control signal Tx.

The reset transistor M2 may have one terminal coupled to one of a power supply voltage VDD and a second power supply voltage VDD_A having a different voltage level from the power supply voltage VDD, the other terminal commonly coupled to a second pad P2 and a gate of the source follower transistor M3, and a gate configured to receive a reset control signal Re. The source follower transistor M3 may have one terminal coupled to a power supply voltage VDD and a gate coupled to the second pad P2.

A floating diffusion area may include the diffusion area of the transmission transistor M1 and the reset transistor M2 and the gate area of the source follower transistor M3. In the present embodiment, the first and second pads P1 and P2 may be included in the floating diffusion area.

Conventionally, the positive terminal of the photodiode PD commonly uses the ground voltage GND used in the second wafer 120. In the present embodiment, however, the positive terminal of the photodiode PD may use the N_ground voltage N_GND having a lower voltage level than the ground voltage GND used in the second wafer 120, thereby increasing a voltage difference between the positive region and the negative region of the photodiode PD. The charge generated through the photodiode PD may be determined according to the intensity of light incident on the photodiode PD. As the voltage difference between both regions of the photodiode PD increases, the charge generated through the photodiode may be effectively transmitted to the floating diffusion area.

Furthermore, the reset voltage applied to the one terminal of the reset transistor M2 can be used as the power supply voltage VDD as it is, but the second power supply voltage VDD_A having a different voltage level from the power supply voltage VDD may be selectively used. Since the reset voltage level of the floating diffusion area can be controlled by adjusting the voltage level of the second power supply voltage VDD_A, the transmission efficiency of transmitting charges generated through the photodiode PD to the floating diffusion area can be improved. This configuration will be applied in the same manner to the following embodiments.

Figure 2:
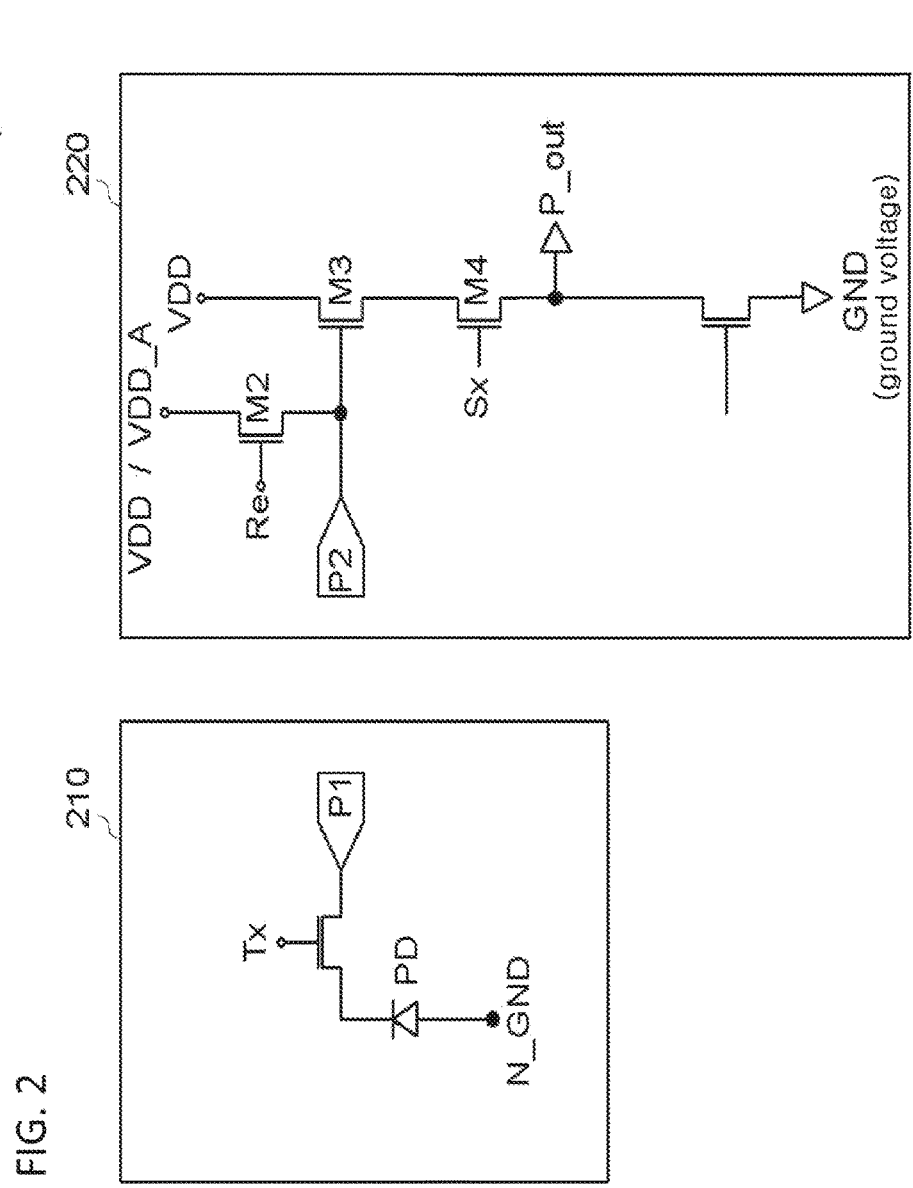
FIG. 2 illustrates a separation type unit pixel of an image sensor having a 3D structure in accordance with a second embodiment of the present invention.

FIG. 2 illustrates a separation type unit pixel of an image sensor having a 3D structure in accordance with a second embodiment of the present invention.

Referring to FIG. 2, the separation type unit pixel 200 of the image sensor in accordance with the second embodiment of the present invention may additionally include a select transistor M4 formed on a second wafer 220, compared to the configuration of the first embodiment 100 of FIG. 1. The select transistor M4 may switch a converted voltage P_out of the source follower transistor M3 coupled to one terminal thereof to the other terminal thereof, in response to a select control signal Sx.

Figure 3:
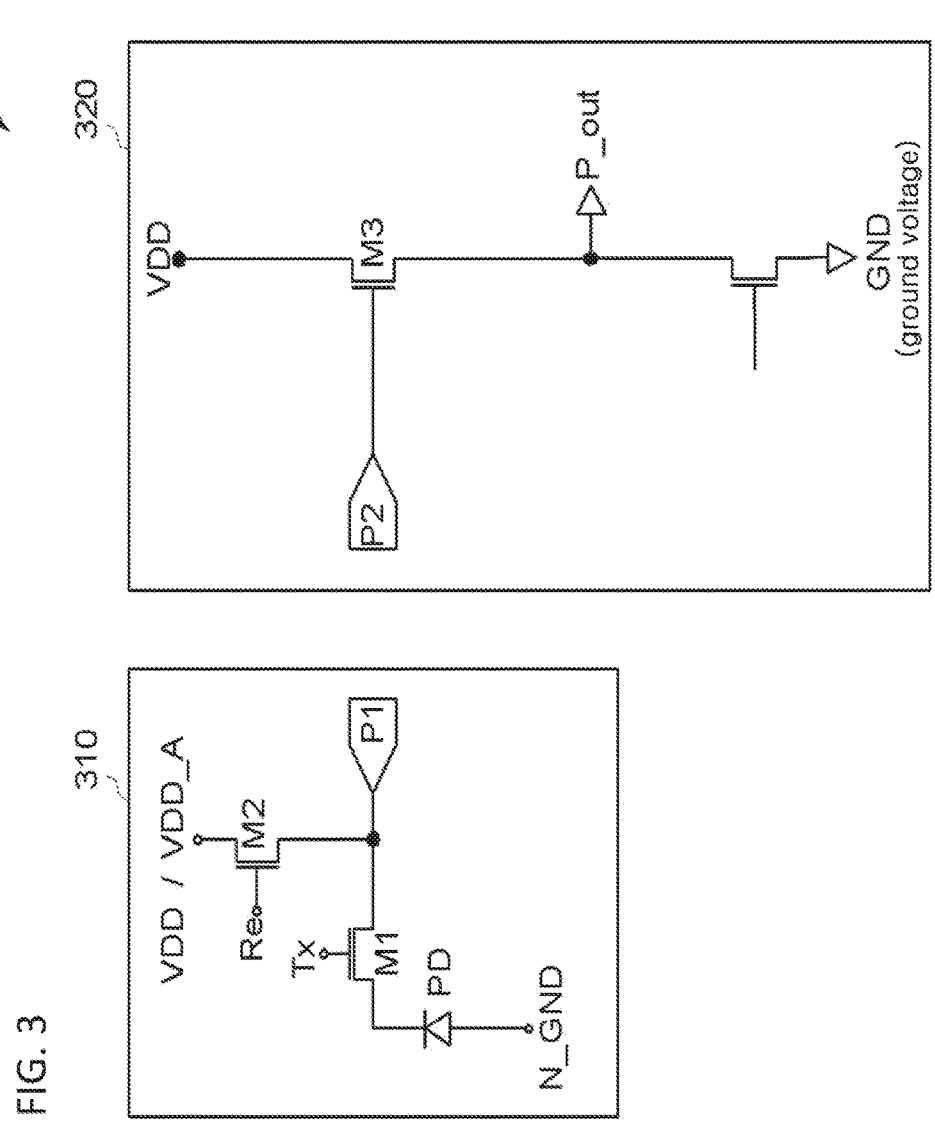
FIG. 3 illustrates a separation type unit pixel of an image sensor having a 3D structure in accordance with a third embodiment of the present invention.

FIG. 3 illustrates a separation type unit pixel of an image sensor having a 3D structure in accordance with a third embodiment of the present invention.

Referring to FIG. 3, a plurality of components forming the separation type unit pixel 300 of the image sensor having a 3D structure in accordance with the third embodiment of the present invention may be divided and formed on two wafers 310 and 320.

The first wafer 310 may include a photodiode PD, a transmission transistor M1, and a reset transistor M2 which are integrated thereon, and the second wafer 320 may include a source follower transistor M3 integrated therein.

The photodiode PD may have a positive region to which an N_ground voltage N_GND is applied, the N_ground voltage N_GND having a lower voltage level than a ground voltage GND used in the second wafer 320. The transmission transistor M1 may have one terminal coupled to a negative region of the photodiode PD, the other terminal coupled to a first pad P1, and a gate configured to receive a transmission control signal Tx. The reset transistor M2 may have one terminal coupled to one of a power supply voltage VDD and a second power supply voltage VDD_A having a different voltage level from the power supply voltage VDD, the other terminal coupled to a common terminal of the first pad P1 and the transmission transistor M1, and a gate configured to receive a reset control signal Re.

The source follower transistor M3 may have one terminal coupled to the power supply voltage VDD, the other terminal configured to output a converted voltage P_out, and a gate coupled to a second pad P2.

In the third embodiment illustrated in FIG. 3, the reset transistor M2 may be integrated on the first wafer 310, while the reset transistor M2 is integrated on the second wafer 120 or 220 on the first or second embodiment 100 or 200.

Figure 4:
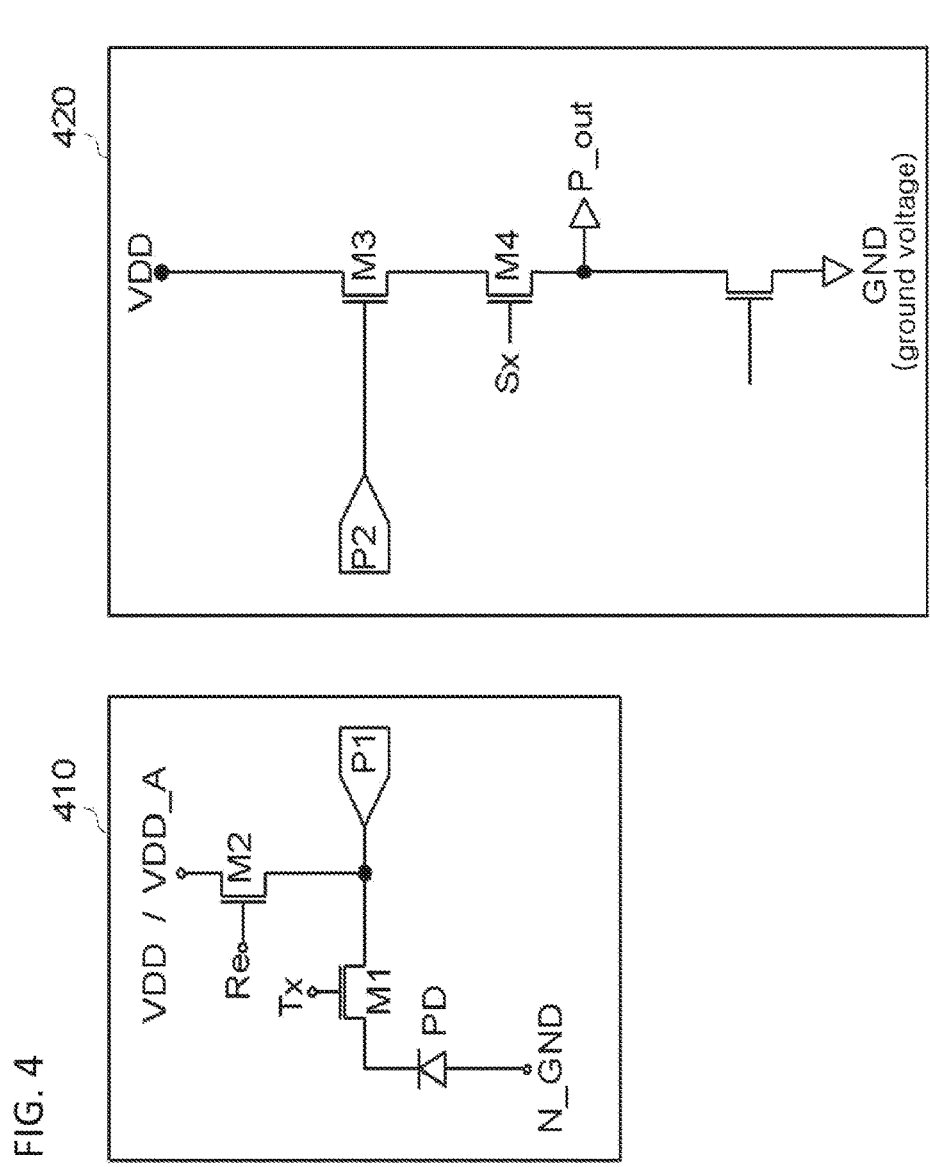
FIG. 4 illustrates a separation type unit pixel of an image sensor having a 3D structure in accordance with a fourth embodiment of the present invention.

FIG. 4 illustrates a separation type unit pixel of an image sensor having a 3D structure in accordance with a fourth embodiment of the present invention.

Referring to FIG. 4, the separation type unit pixel 400 of the image sensor in accordance with the fourth embodiment of the present invention may additionally include a select transistor M4 integrated on a second wafer 420, compared to the configuration of the third embodiment 300 of FIG. 3. The select transistor M4 may switch a converted voltage P_out of the source follower transistor M3 coupled to one terminal thereof to the other terminal thereof, in response to a select control signal Sx.

Figure 5:
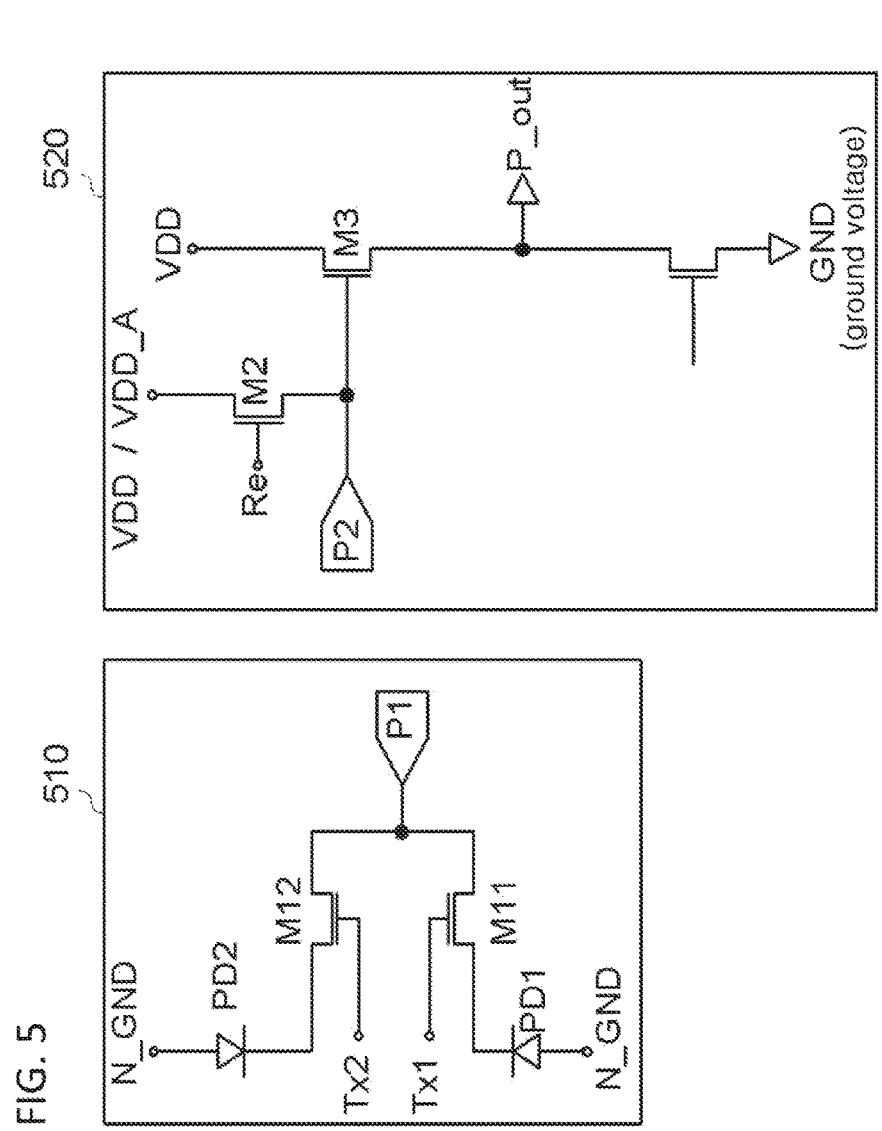
FIG. 5 illustrates a separation type unit pixel of an image sensor having a 3D structure in accordance with a fifth embodiment of the present invention.

FIG. 5 illustrates a separation type unit pixel of an image sensor having a 3D structure in accordance with a fifth embodiment of the present invention.

Referring to FIG. 5, the separation type unit pixel 500 of the image sensor in accordance with the fifth embodiment of the present invention may include a first wafer 510 on which two photodiodes PD1 and PD2 and two transmission transistors are integrated and a second wafer 520 on which a reset transistor M2 and a source follower transistor M3 are integrated.

One pixel requires a photodiode and a transmission transistor. Thus, in the fifth embodiment, charges transmitted through photodiodes and transmission transistors which are included in two pixels may be selectively processed through one processing circuit integrated on the second wafer.

The first photodiode PD1 may have a positive region to which an N_ground voltage N_GND is applied. The transmission transistor M11 may have one terminal coupled to a negative region of the first photodiode PD1, the other terminal coupled to the first pad P1, and a gate configured to receive a first transmission control signal Tx1. The second photodiode PD2 may have a positive region to which an N_ground voltage N_GND is applied. The second transmission transistor M12 may have one terminal coupled to a negative region of the second photodiode PD2, the other terminal coupled to the first pad, and a gate configured to receive a second transmission control signal Tx2.

The reset transistor M2 may have one terminal coupled to one of a power supply voltage VDD and a second power supply voltage VDD_A having a different voltage level from the power supply voltage VDD, the other terminal coupled to the second pad P2, and a gate configured to receive a reset control signal Re. The source follower transistor M3 may have one terminal coupled to the power supply voltage VDD and the other terminal configured to output a converted voltage P_out corresponding to a charge stored in the second pad P2 and the other terminal of the reset transistor M2.

Figure 6:
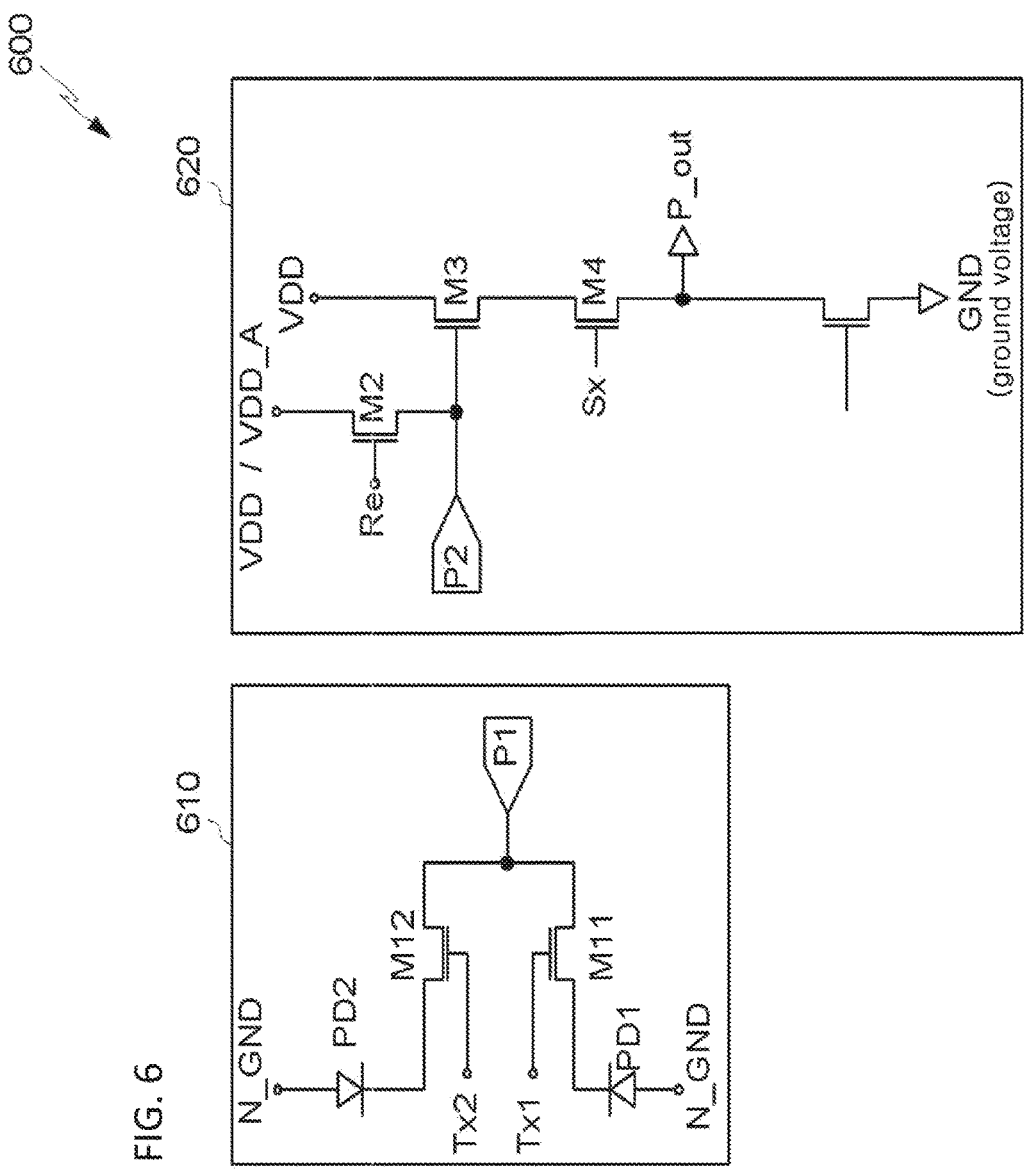
FIG. 6 illustrates a separation type unit pixel of an image sensor having a 3D structure in accordance with a sixth embodiment of the present invention.

FIG. 6 illustrates a separation type unit pixel of an image sensor having a 3D structure in accordance with a sixth embodiment of the present invention.

Referring to FIG. 6, the separation type unit pixel 600 of the image sensor in accordance with the sixth embodiment of the present invention may additionally include a select transistor M4 integrated on a second wafer 620, compared to the configuration of the fifth embodiment 500 of FIG. 5. The select transistor M4 may switch a converted voltage P_out of a source follower transistor M3 coupled to one terminal thereof to the other terminal thereof, in response to a select control signal Sx.

An actual image sensor may further include a transparent buffer layer and a filter over the above-described elements. Since this configuration is widely known to those skilled in the art, the detailed descriptions thereof are omitted herein.

In the actual image sensor, first and second pads P1 and P2 may be electrically coupled to each other through a pad coupling unit. Since this configuration can be easily implemented by those skilled in the art, the detailed descriptions thereof are omitted herein.

While various embodiments have been described above, it will be understood to those skilled in the art that the embodiments described are by way of example only. Accordingly, the disclosure described herein should not be limited based on the described embodiments.

The invention claimed is:

1. A separation type unit pixel of an image sensor which generates a converted voltage corresponding to incident light, the separation type unit pixel comprising:
a first wafer comprising a photodiode configured to generate a charge corresponding to incident light, a first pad, and a transmission transistor configured to transmit the charge generated through the photodiode to the first pad in response to a transmission control signal; and
a second wafer comprising a second pad, a source follower transistor configured to generate a converted voltage corresponding to a charge transmitted to the second pad, and a reset transistor configured to commonly reset the second pad and a gate of the source follower transistor in response to a reset control signal,
wherein the photodiode of the first wafer has a positive region to which a voltage having a lower level than a ground voltage used in the second wafer is applied.

2. The separation type unit pixel of claim 1, wherein the transmission transistor has one terminal coupled to a negative region of the photodiode, the other terminal coupled to the first pad, and a gate configured to receive the transmission control signal,
the reset transistor has one terminal coupled to one of a power supply voltage and a second power supply voltage having a different voltage level from the power supply voltage, the other terminal commonly coupled to the second pad and the gate of the source follower transistor, and a gate configured to receive the reset control signal, and
the source follower transistor has one terminal coupled to the power supply voltage and the other terminal configured to output the converted voltage.

3. The separation type unit pixel of claim 2, wherein the second wafer further comprises a select transistor configured to switch the converted voltage generated through the source follower transistor in response to a select control signal, and
the select transistor has a gate configured to receive the select control signal, one terminal coupled to the other terminal of the source follower transistor, and the other terminal configured to output the converted voltage.

4. A separation type unit pixel of an image sensor which generates a converted voltage corresponding to incident light, the separation type unit pixel comprising:
a first wafer comprising a photodiode configured to generate a charge corresponding to incident light, a first pad, a transmission transistor configured to transmit the charge generated through the photodiode to the first pad in response to a transmission control signal, and a reset transistor configured to reset a common terminal of the first pad and the transmission transistor in response to a reset control signal; and
a second wafer comprising a second pad and a source follower transistor configured to generate a converted voltage corresponding to a charge transmitted to the second pad,
wherein the photodiode of the first wafer has a positive region to which a voltage having a lower level than a ground voltage used in the second wafer is applied.

5. The separation type unit pixel of claim 4, wherein the transmission transistor has one terminal coupled to a negative region of the photodiode, the other terminal coupled to the first pad, and a gate configured to receive the transmission control signal,
the reset transistor has one terminal coupled to one of a power supply voltage and a second power supply voltage having a different voltage level from the power supply voltage, the other terminal commonly coupled to the first pad and the other terminal of the transmission transistor, and a gate configured to receive the reset control signal, and the source follower transistor has one terminal coupled to the power supply voltage, a gate coupled to the second pad, and the other terminal configured to output the converted voltage.

6. The separation type unit pixel of claim 5, wherein the second wafer further comprises a select transistor configured to switch the converted voltage generated through the source follower transistor in response to a select control signal, and the select transistor has a gate configured to receive the select control signal, one terminal coupled to the other terminal of the source follower transistor, and the other terminal configured to output the converted voltage.

7. A separation type unit pixel of an image sensor which generates a converted voltage corresponding to incident light, the separation type unit pixel comprising:

a first wafer comprising a first pad, a first photodiode configured to generate a charge corresponding to incident light, a first transmission transistor configured to transmit the charge generated through the first photodiode to the first pad in response to a first transmission control signal, a second photodiode configured to generate a charge corresponding to incident light, and a second transmission transistor configured to transmit the charge generated through the second photodiode to the first pad in response to a second transmission control signal; and a second wafer comprising a second pad, a source follower transistor configured to generate a converted voltage corresponding to a charge transmitted to the second pad, and a reset transistor configured to commonly reset the second pad and a gate of the source follower transistor in response to a reset control signal, wherein each of the first and second photodiodes of the first wafer has a positive region to which a voltage having a lower level than a ground voltage used in the second wafer is applied.

8. The separation type unit pixel of claim 7, wherein the first photodiode receives the voltage having a lower level than the ground voltage through the positive region thereof, the first transmission transistor has one terminal coupled to a negative region of the first photodiode, the other terminal coupled to the first pad, and a gate configured to receive the first transmission control signal, the second photodiode receives the voltage having a lower level than the ground voltage through the positive region thereof, the second transmission transistor has one terminal coupled to the negative region of the second photodiode, the other terminal coupled to the first pad, and a gate configured to receive the second transmission control signal, the reset transistor has one terminal coupled to one of a power supply voltage and a second power supply voltage having a voltage level different from the power supply voltage, the other terminal coupled to the second pad, and a gate configured to receive the reset control signal, and the source follower transistor has one terminal coupled to the power supply voltage and the other terminal configured to output a converted voltage corresponding to a charge stored in the second pad and the other terminal of the reset transistor.

9. The separation type unit pixel of claim 8, wherein the second wafer further comprises a select transistor configured to switch the converted voltage generated through the source follower transistor in response to a select control signal, and the select transistor has a gate configured to receive the select control signal, one terminal coupled to the other terminal of the source follower transistor, and the other terminal configured to output the converted voltage.

10. The separation type unit pixel of claim 1, wherein the first and second pads are electrically coupled to each other through a pad coupling unit.

11. The separation type unit pixel of claim 2, wherein the first and second pads are electrically coupled to each other through a pad coupling unit.

12. The separation type unit pixel of claim 3, wherein the first and second pads are electrically coupled to each other through a pad coupling unit.

13. The separation type unit pixel of claim 4, wherein the first and second pads are electrically coupled to each other through a pad coupling unit.

14. The separation type unit pixel of claim 5, wherein the first and second pads are electrically coupled to each other through a pad coupling unit.

15. The separation type unit pixel of claim 6, wherein the first and second pads are electrically coupled to each other through a pad coupling unit.

16. The separation type unit pixel of claim 7, wherein the first and second pads are electrically coupled to each other through a pad coupling unit.

17. The separation type unit pixel of claim 8, wherein the first and second pads are electrically coupled to each other through a pad coupling unit.

18. The separation type unit pixel of claim 9, wherein the first and second pads are electrically coupled to each other through a pad coupling unit.

* * * * *